United States Patent
Kaguchi et al.

(10) Patent No.: US 8,860,451 B2
(45) Date of Patent: Oct. 14, 2014

(54) JIG FOR SEMICONDUCTOR TEST

(75) Inventors: Naoto Kaguchi, Tokyo (JP); Masaaki Ikegami, Tokyo (JP)

(73) Assignee: Mitshubishi Electronic Corporation, Tokyo (JP)

( * ) Notice: Subject to any disclaimer, the term of this patent is extended or adjusted under 35 U.S.C. 154(b) by 188 days.

(21) Appl. No.: 13/368,558

(22) Filed: Feb. 8, 2012

(65) Prior Publication Data

US 2012/0299613 A1 Nov. 29, 2012

(30) Foreign Application Priority Data

May 25, 2011 (JP) .................................. 2011-116583

(51) Int. Cl.
G01R 31/26 (2014.01)
G01R 1/04 (2006.01)
G01R 1/067 (2006.01)
G01R 31/28 (2006.01)
H01L 21/66 (2006.01)
G01R 31/12 (2006.01)

(52) U.S. Cl.
CPC .............. G01R 1/04 (2013.01); G01R 1/06777 (2013.01); *H01L 22/14* (2013.01); G01R 31/2886 (2013.01); *G01R 31/2887* (2013.01); *G01R 31/129* (2013.01); *G01R 31/2879* (2013.01)
USPC .................................................... 324/756.01

(58) Field of Classification Search
CPC .. G01R 1/04; G01R 1/06777; G01R 31/2886; G01R 31/2887; H01L 22/14
USPC ................. 324/762.01–762.1, 764.01–754.5, 324/750.01–750.3
See application file for complete search history.

(56) References Cited

U.S. PATENT DOCUMENTS

| 7,368,927 B2 * | 5/2008 | Smith et al. ............... 324/754.07 |
| 2008/0297184 A1 * | 12/2008 | Miura et al. .................. 324/754 |
| 2012/0001200 A1 | 1/2012 | Ikoshi et al. |

FOREIGN PATENT DOCUMENTS

| CN | 1198817 A | 11/1998 |
| JP | 4-165653 | 6/1992 |
| JP | 2000-183282 | 6/2000 |
| JP | 2010-205814 | 9/2010 |
| KR | 10-2001-0010503 A | 2/2001 |
| KR | 10-2001-0015902 A | 2/2011 |
| TW | 200606436 | 2/2006 |

OTHER PUBLICATIONS

U.S. Appl. No. 13/476,342, filed May 21, 2012, Ikegami.
Office Action issued on Jun. 18, 2013 in the corresponding Korean Patent Application No. 10-2012-0049506 (with partial English Translation).
Office Action issued Apr. 30, 2014 in Chinese Patent Application No. 201210068143.7 (partial English Translation).

* cited by examiner

*Primary Examiner* — Tung X Nguyen
(74) *Attorney, Agent, or Firm* — Oblon, Spivak, McClelland, Maier & Neustadt, L.L.P.

(57) ABSTRACT

A jig for use in a semiconductor test includes: a base on which a probe pin and an insulating material are placed, the insulating material surrounding the probe pin in plan view; and a stage arranged to face a surface of the base on which the probe pin and the insulating material are placed. The stage is capable of holding a test object on a surface of the stage facing the base. When the base and the stage move in a direction in which they go closer to each other while the test object is placed on the stage, the probe pin comes into contact with an electrode formed on the test object and the insulating material comes into contact with the test object.

9 Claims, 8 Drawing Sheets

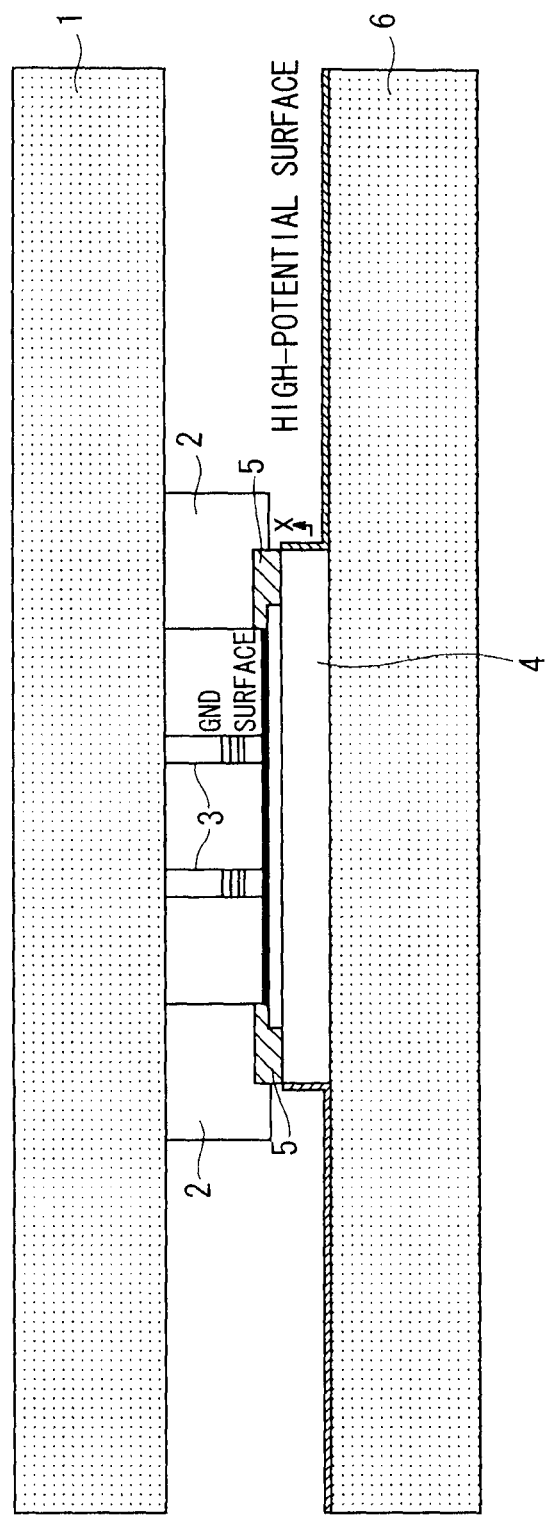

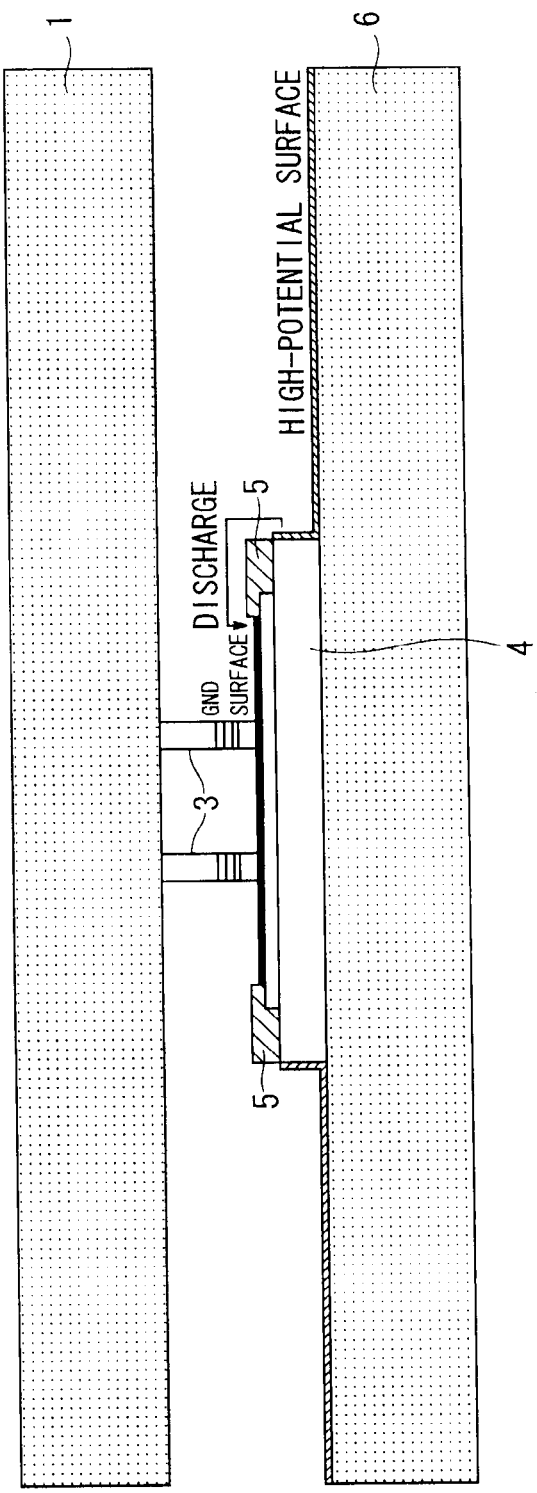

JIG FOR SEMICONDUCTOR TEST

BACKGROUND OF THE INVENTION

1. Field of the Invention

The present invention relates to a jig for use in a semiconductor test, and more specifically, to a jig used suitably in check of a wide-gap semiconductor.

2. Description of the Background Art

Regarding a wide-gap semiconductor as a semiconductor with a high breakdown voltage, a semiconductor chip of such a wide-gap semiconductor is conventionally subjected to a test of a breakdown voltage and a test conducted by applying a high voltage such as a shut-down test (hereinafter also called a test) before the semiconductor chip is mounted. In order to extract and remove a defective chip in advance, the semiconductor chip may be provided with a chip frame made of an insulating resin to protect the semiconductor chip from creeping discharge to be generated at a terminal portion of junction (as disclosed for example in Japanese Patent Application Laid-Open No. 2000-183282 (FIG. 1), hereinafter called patent literature 1).

Shrinkage (size reduction) of a terminal portion of a wide-gap semiconductor is realized by enhancing the performance of a wafer process and enhancing the quality of a wafer material. Shrinkage of the terminal portion contributes largely to reduction of manufacturing costs of a semiconductor chip. So, it is considered that shrinkage of the terminal portion will proceed further in the future.

Patent literature 1 discloses a structure where a terminal portion is covered by a chip frame made of an insulating resin to protect a semiconductor chip from discharge to be generated at the terminal portion. However, discharge is still generated at the terminal portion if the terminal portion shrinks as described above.

SUMMARY OF THE INVENTION

It is an object of the present invention to provide a jig for use in a semiconductor test capable of preventing generation of discharge at a terminal portion of semiconductor during a test.

The jig for use in a semiconductor test of the present invention includes: a base on which a probe pin and an insulating material are placed, the insulating material surrounding the probe pin in plan view; and a stage arranged to face a surface of the base on which the probe pin and the insulating material are placed. The stage is capable of holding a test object on a surface of the stage facing the base. When the base and the stage move in a direction in which they go closer to each other while the test object is placed on the stage, the probe pin comes into contact with an electrode formed on the test object and the insulating material comes into contact with the test object.

In the invention, the jig for use in a semiconductor test includes: a jig base on which a probe pin and an insulating material are placed, the insulating material surrounding the probe pin in plan view; and a stage arranged to face a surface of the jig base on which the probe pin and the insulating material are placed. The stage is capable of holding a test object on a surface of the stage facing the jig base. When the jig base and the stage move in a direction in which they go closer to each other while the test object is placed on the stage, the probe pin comes into contact with an electrode formed on the test object and the insulating material comes into contact with the test object. Thus, generation of discharge at a terminal portion of semiconductor is prevented during a test.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows how a test is conducted with the jig for use in a semiconductor test according to the preferred embodiment of the present invention;

FIG. 8 shows how a test is conducted with the jig for use in a semiconductor test according to the prerequisite technique.

EMBODIMENT FOR CARRYING OUT THE INVENTION

A preferred embodiment of the present invention is described below by referring to drawings.

A technique prerequisite to the present invention (prerequisite technique) is described first.

<Prerequisite Technique>

Figure 7A:
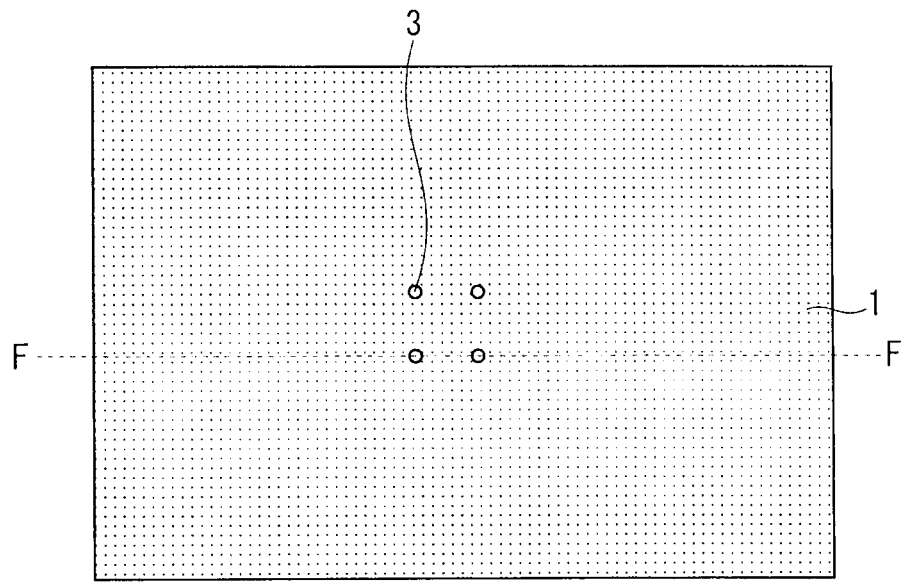
FIGS. 7A, 7B and 7C show an exemplary structure of a jig for use in a semiconductor test according to a prerequisite technique.
Figure 7B:
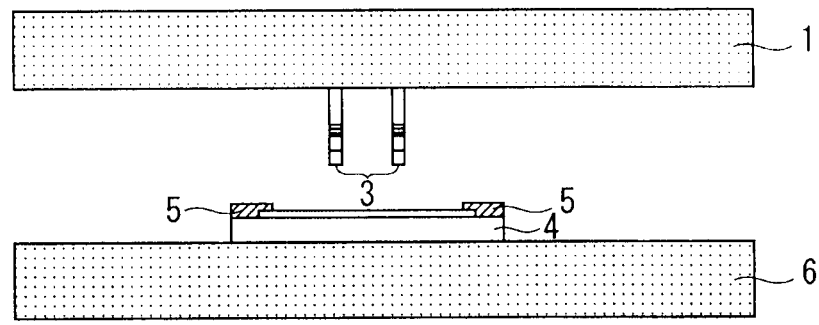
Figure 7C:
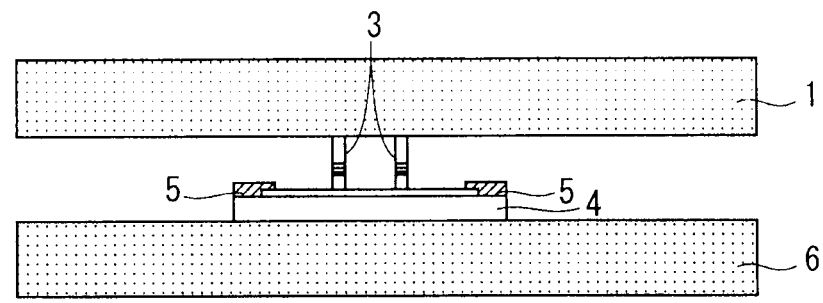

FIGS. 7A, 7B and 7C show an exemplary structure of a jig for use in a semiconductor test according to the prerequisite technique. FIGS. 7B and 7C are sectional views taken along line F-F of FIG. 7A. FIG. 7A is a plan view of a base 1 as seen from a stage 6 of FIG. 7B. As shown in FIGS. 7A, 7B and 7C, the jig for use in a semiconductor test includes the base 1, probe pins 3, and the stage 6.

The base 1 is provided with the probe pins 3, and a test object 4 with a terminal portion 5 is placed on the stage 6 as shown in FIG. 7B. During a test for the test object 4, the probe pins 3 contact an electrode (surface electrode) formed on a surface of the test object 4 as shown in FIG. 7C.

FIG. 8 shows how a test is conducted with the jig for use in a semiconductor test according to the prerequisite technique. As shown in FIG. 8, shrinkage of the terminal portion 5 of the test object 4 shortens an insulation distance between a GND surface formed on the surface of the test object 4 and a high-potential surface (indicated by tightly pitched hatch lines) formed on a surface of the stage 6, resulting in a problem of generation of discharge at the terminal portion 5.

The present invention described in detail below is intended to solve the aforementioned problem.

<Preferred Embodiment>

Figure 1A:
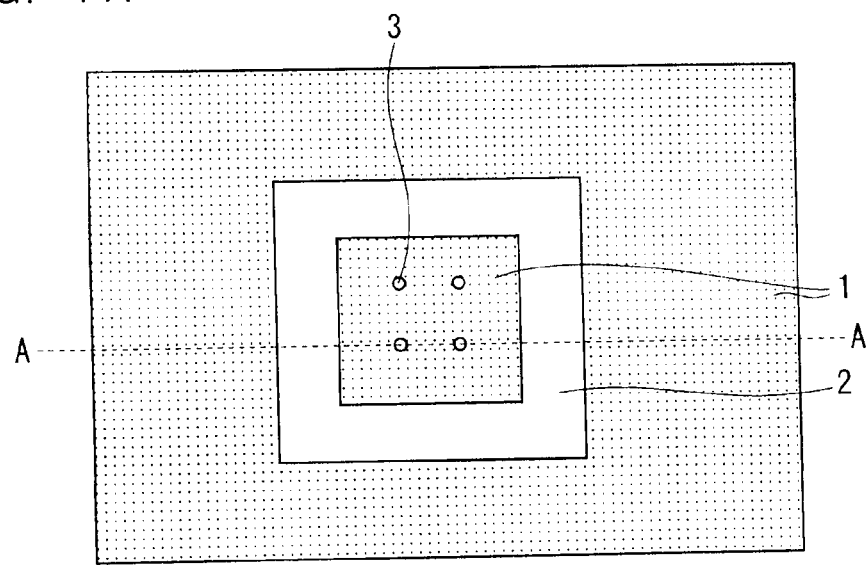
FIGS. 1A, 1B and 1C show an exemplary structure of a jig for use in a semiconductor test according to a preferred embodiment of the present invention.
Figure 1B:
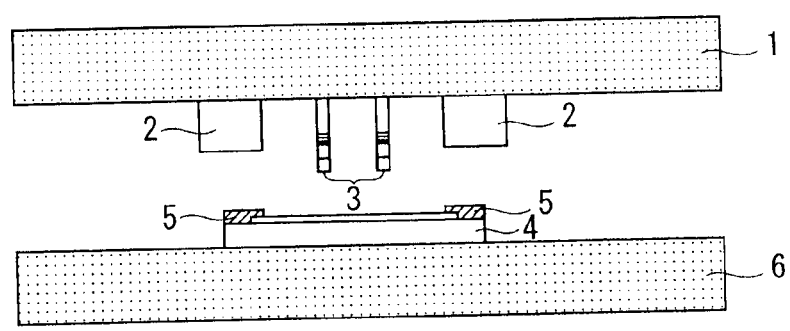
Figure 1C:
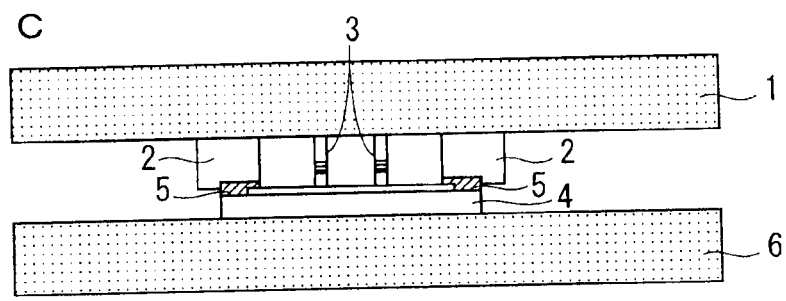

FIGS. 1A, 1B and 1C show an exemplary structure of a jig for use in a semiconductor test according to a preferred embodiment of the present invention. FIGS. 1B and 1C are sectional views taken along line A-A of FIG. 1A. FIG. 1A is a plan view of a base 1 as seen from a stage 6 of FIG. 1B.

As shown in FIGS. 1A, 1B and 1C, the jig for use in a semiconductor test according to the preferred embodiment includes: a base 1 (jig base) on which a probe pins 3 and an insulating material 2 of a hollow structure surrounding the probe pins 3 in plan view are placed; and a stage 6 arranged to face a surface of the base 1 on which the probe pins 3 and the insulating material 2 are placed. The stage 6 is capable of holding the test object 4 on a surface of the stage 6 facing the base 1. The test object 4 is provided with a terminal portion 5.

FIG. 2 shows how a test is conducted with the jig for use in a semiconductor test according to the preferred embodiment. As shown in FIG. 2, the probe pins 3 are in contact with a surface electrode formed on a surface of the test object 4, and the insulating material 2 is in contact with the terminal portion 5 of the test object 4 during the test. To be specific, when the base 1 and the stage 6 move in a direction in which they go closer to each other while the test object 4 is placed on the stage 6, the probe pins 3 come into contact with the surface electrode (electrode) formed on the test object 4 and the insulating material 2 comes into contact with the test object 4.

As an example, the surface electrode formed on the surface of the test object 4 and which is to be in contact with the probe pins 3 is an anode electrode if the test object 4 is a diode, an emitter electrode if the test object 4 is an IGBT (insulated gate bipolar transistor), and is a source electrode if the test object 4 is a MOSFET (metal-oxide semiconductor field effect transistor).

Contact between the insulating material 2 and the test object 4 isolates a GND surface formed on the surface of the test object 4 and a high-potential surface formed on the surface of the stage 6. This makes an insulation distance longer between the GND surface and the high-potential surface, so that discharge at the terminal portion 5 is prevented. Thus, in the preferred embodiment, the insulating material 2 isolates the GND surface and the high-potential surface from each other only during a time when a test is conducted.

The insulating material 2 of the preferred embodiment is in contact with the terminal portion 5 of the test object 4. However, the insulating material 2 may be in contact with any place of the test object 4 except the terminal portion 5 as long as isolation between the high-potential surface and the GND surface is ensured as shown in FIG. 2.

Figure 3A:
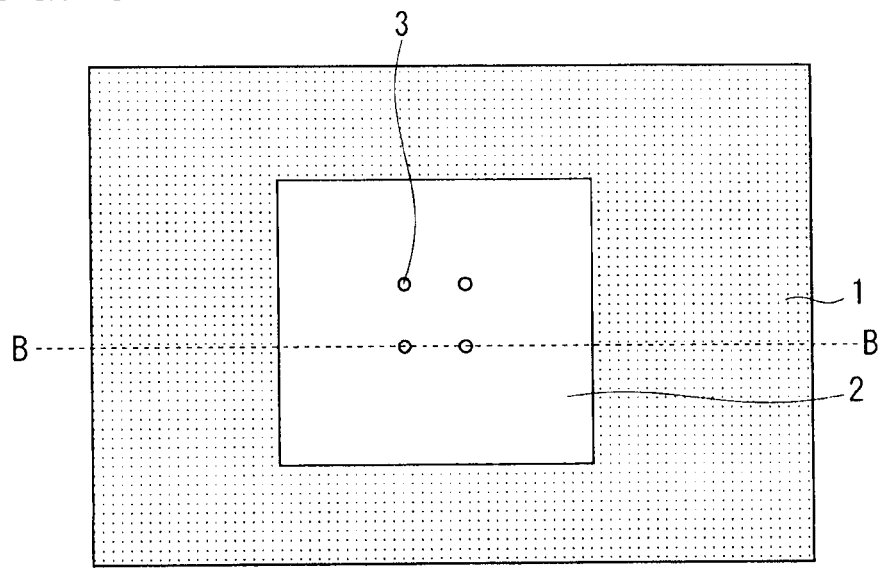
FIGS. 3A, 3B and 3C show an exemplary structure of a jig for use in a semiconductor test according to the preferred embodiment of the present invention.
Figure 3B:
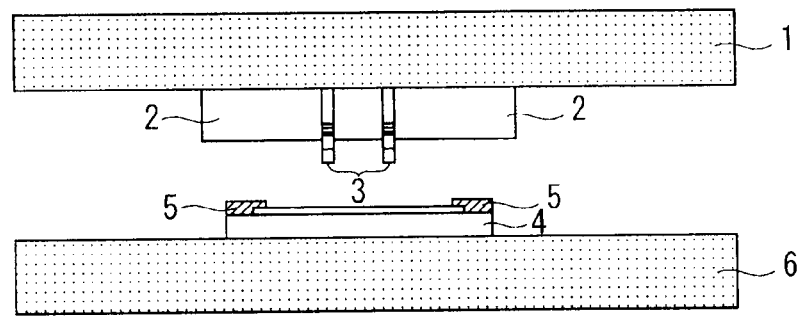
Figure 3C:
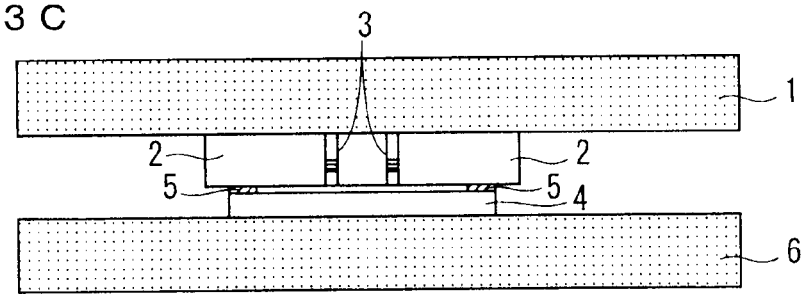

FIGS. 3A, 3B and 3C show a different exemplary structure of a jig for use in a semiconductor test according to the preferred embodiment. FIGS. 3B and 3C are sectional views taken along line B-B of FIG. 3A. FIG. 3A is a plan view of the base 1 as seen from the stage 6 of FIG. 3B.

As shown in FIGS. 3A, 3B and 3C, the probe pins 3 are surrounded by the insulating material 2 of a solid structure in plan view, and the tip end portions of the probe pins 3 are exposed from the insulating material 2. The jig of FIGS. 3A, 3B and 3C has the same structure in other respects as the structure of FIGS. 1A, 1B and 1C, and achieves the same effect as that obtained by the structure of FIGS. 1A, 1B and 1C.

Figure 4A:
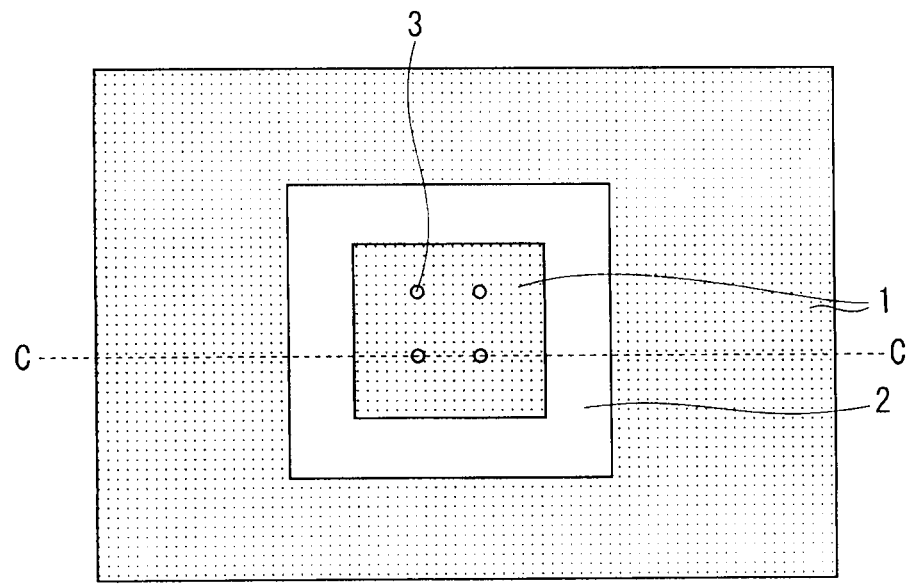
FIGS. 4A, 4B and 4C show an exemplary structure of a jig for use in a semiconductor test according to the preferred embodiment of the present invention.
Figure 4B:
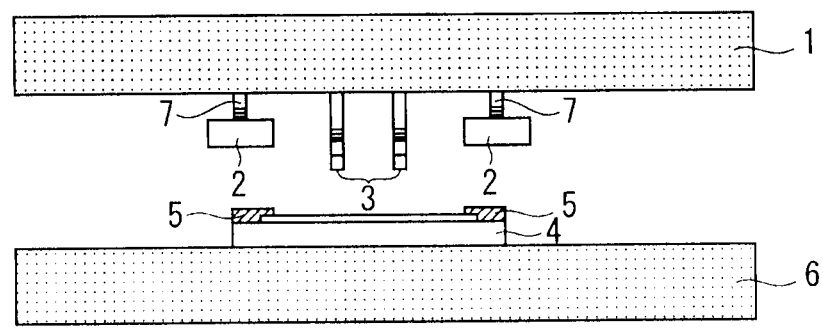
Figure 4C:
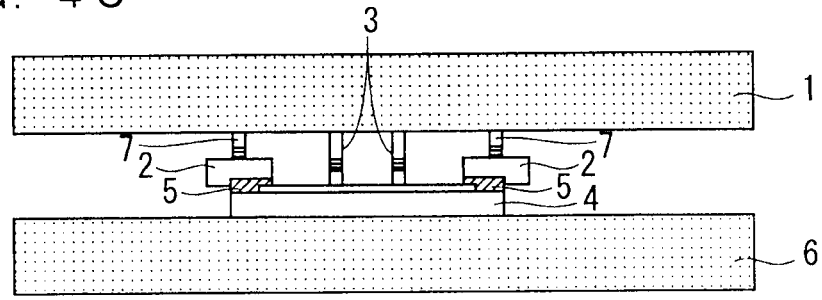

FIGS. 4A, 4B and 4C also show a different exemplary structure of a jig for use in a semiconductor test according to the preferred embodiment. FIGS. 4B and 4C are sectional views taken along line C-C of FIG. 4A. FIG. 4A is a plan view of the base 1 as seen from the stage 6 of FIG. 4B.

As shown in FIGS. 4A, 4B and 4C, the base 1 includes elastic members 7 placed between the base 1 and the insulating material 2. The jig of FIGS. 4A, 4B and 4C has the same structure in other respects as the structure of FIGS. 1A, 1B and 1C, and achieves the same effect as that obtained by the structure of FIGS. 1A, 1B and 1C.

Examples of the elastic members 7 include spring pins and springs. Provision of the elastic members 7 achieves additional effect in that an allowable range of the thickness of the test object 4 is expanded, and stress on the test object 4 is relaxed.

Figure 5A:
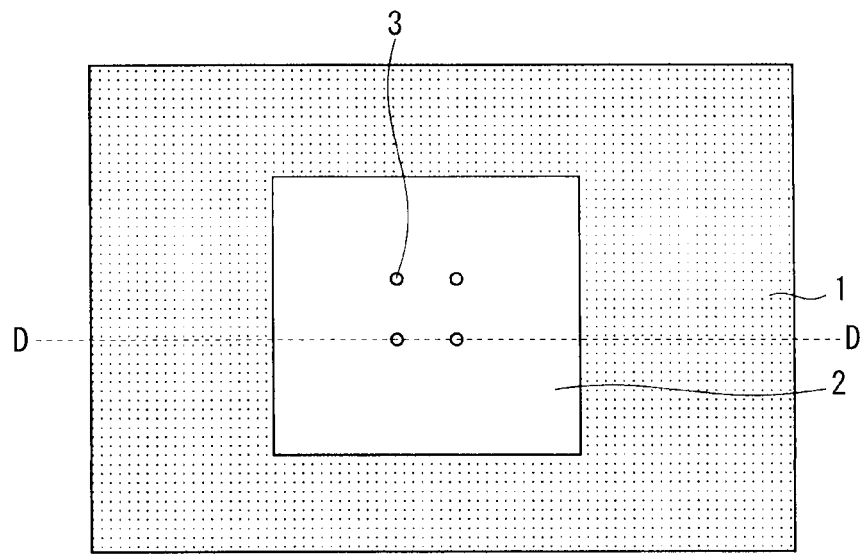
FIGS. 5A, 5B and 5C show an exemplary structure of a jig for use in a semiconductor test according to the preferred embodiment of the present invention.
Figure 5B:
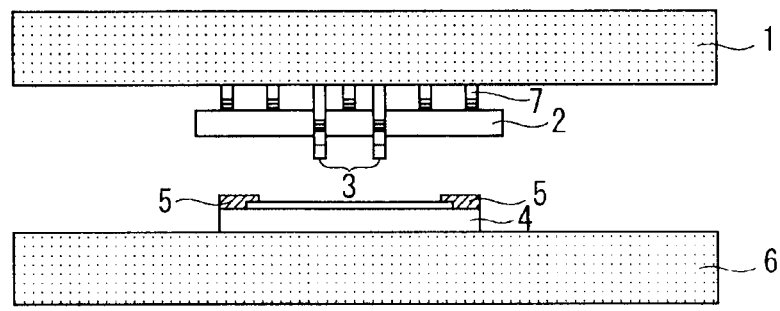
Figure 5C:
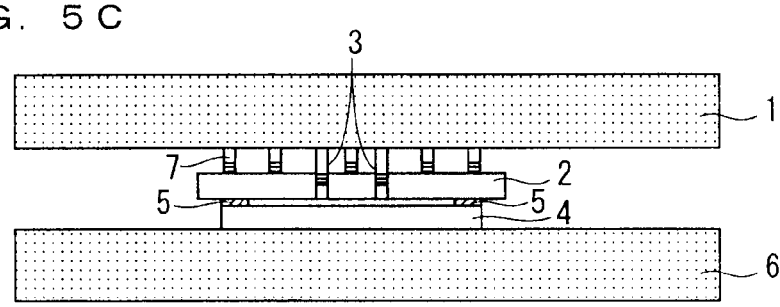

FIGS. 5A, 5B and 5C also show a different exemplary structure of a jig for use in a semiconductor test according to the preferred embodiment. FIGS. 5B and 5C are sectional views taken along line D-D of FIG. 5A. FIG. 5A is a plan view of the base 1 as seen from the stage 6 of FIG. 5B.

As shown in FIGS. 5A, 5B and 5C, the probe pins 3 are surrounded by the insulating material 2 of a solid structure in plan view, and the tip end portions of the probe pins 3 are exposed from the insulating material 2. The jig of FIGS. 5A, 5B and 5C has the same structure in other respects as the structure of FIGS. 4A, 4B and 4C, and achieves the same effect as that obtained by the structure of FIGS. 4A, 4B and 4C.

Figure 6:
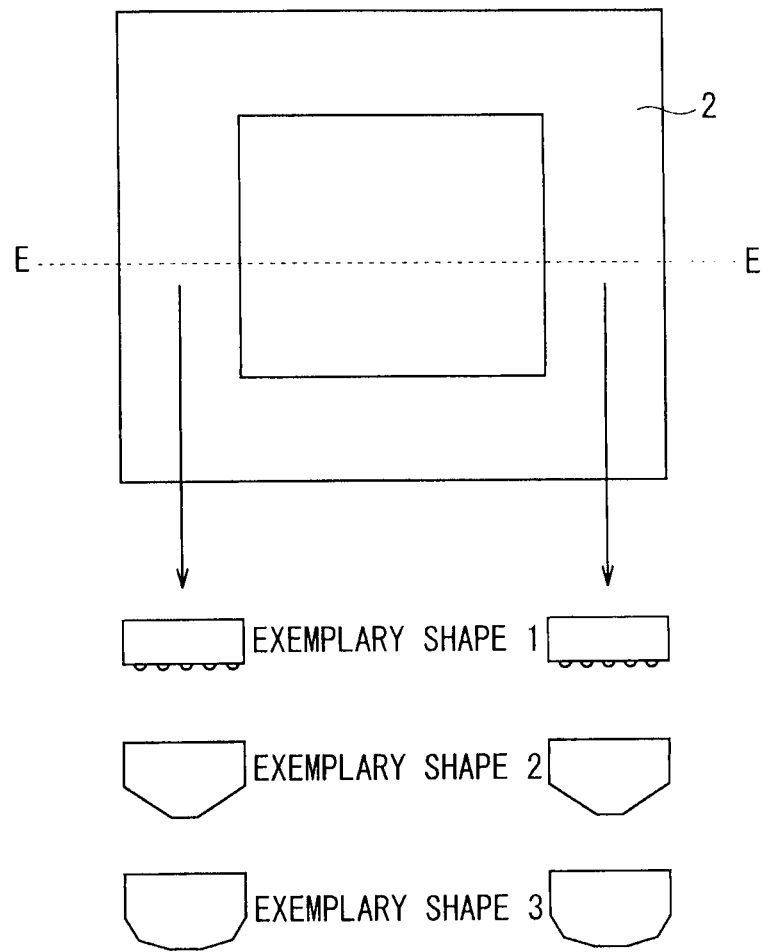
FIG. 6 shows exemplary shapes of an insulating material according to the preferred embodiment of the present invention.

FIG. 6 shows exemplary shapes of an insulating material of the preferred embodiment. Exemplary shapes 1, 2 and 3 of FIG. 6 correspond to the shapes of the insulating material 2 taken along line E-E.

As shown in the exemplary shapes 1, 2 and 3 of FIG. 6, the shape of a surface of the insulating material 2 facing the test object 4 is such that only part of the facing surface comes into contact with the test object 4.

Processing the surface of the insulating material 2 to achieve the exemplary shapes 1 to 3 shown in FIG. 6 makes it possible to reduce a contact area between the insulating material 2 and the test object 4, compared to the case where the surface of the insulating material 2 is flat. Reducing the contact area maintains close contact between the insulating material 2 and the test object 4 during a test, and relieves the close contact therebetween when the insulating material 2 and the test object 4 come out of contact with each other after the test. This reduces a damage to be generated at a portion where the insulating material 2 and the test object 4 are in contact with each other.

A process such as coating of the surface of the insulating material 2 (surface to face the test object 4) with Teflon (registered trademark) also maintains close contact between the insulating material 2 and the test object 4 during a test, and relieves the close contact therebetween when the insulating material 2 and the test object 4 come out of contact with each other after the test. This reduces a damage to be generated at a portion where the insulating material 2 and the test object 4 are in contact with each other.

In order to facilitate placement of the insulating material 2 on the base 1 in FIGS. 1A to 1C and FIGS. 3A to 3C, a recess in the same shape as the insulating material 2 may be formed in the base 1 at a place where the base 1 comes into contact with the insulating material 2. To be specific, the base 1 may be provided with a recess to define a position to place the insulating material 2. Provision of this recess makes it possible to place the insulating material 2 easily compared to the case where the insulating material 2 is placed on a plane with no recess, thereby preventing displacement of the insulating material 2 to be generated when the insulating material 2 is placed on the base 1.

The insulating material 2 may be of any shape as long as such this shape ensures isolation between the high-potential surface and the GND surface. As an example, the solid shape of the insulating material 2 with four holes (FIGS. 3A to 3C and FIGS. 5A to 5C) is for a test intended only for measurement of leakage of a breakdown voltage. Meanwhile, the hollow shape of the solid insulating material 2 that is square in outline (FIGS. 1A to 1C and FIGS. 4A to 4C) is for a test intended for measurement of leakage of a breakdown voltage and measurement of a large current.

The insulating material 2 shown in FIGS. 1A to 1C, FIG. 2, FIGS. 3A to 3C, FIGS. 4A to 4C, and FIGS. 5A to 5C, is made of a silicone-based material or an organic material having high insulating properties for prevention of discharge, and having softness in order to prevent generation of a damage on the test object 4 during a test. To be specific, the insulating material 2 contains a silicone-based material or an organic material.

The jig for use in a semiconductor test of the preferred embodiment is applicable as a jig for use in a wafer test or a chip test.

The jig for use in a semiconductor test according to the preferred embodiment is applicable as a jig for use in a DC test or an AC test.

The jig for use in a semiconductor test of the preferred embodiment is applied effectively if the test object 4 is made of Si, or a wide-gap semiconductor such as SiC and GaN. In particular, the jig for use in a semiconductor test of the present invention is used effectively in a test for a wide-gap semiconductor during which discharge is easily generated at the terminal portion 5 of the test object 4 as a result of application of a high voltage to the wide-gap semiconductor, namely to the test object 4.

As described above, the preferred embodiment is capable of preventing discharge at a terminal portion of semiconductor during a test.

While the invention has been shown and described in detail, the foregoing description is in all aspects illustrative and not restrictive. It is therefore understood that numerous modifications and variations can be devised without departing from the scope of the invention.

What is claimed is:

1. A jig for use in a semiconductor test, comprising:
   a jig base on which a probe pin and an insulating material are placed, the insulating material surrounding said probe pin in plan view; and
   a stage arranged to face a surface of said jig base on which said probe pin and said insulating material are placed, the stage being capable of holding a test object on a surface of the stage facing said jig base, wherein
   when said jig base and said stage move in a direction in which they go closer to each other while said test object is placed on said stage, said probe pin comes into contact with an electrode formed on said test object and said insulating material comes into contact with said test object.

2. The jig for use in a semiconductor test according to claim 1, wherein said insulating material contains a silicone-based material or an organic material.

3. The jig for use in a semiconductor test according to claim 1, wherein said jig base is provided with a recess to define a position to place said insulating material.

4. The jig for use in a semiconductor test according to claim 1, wherein said jig base further includes an elastic member placed between said jig base and said insulating material.

5. The jig for use in a semiconductor test according to claim 1, which is a jig for use in a wafer test or a chip test.

6. The jig for use in a semiconductor test according to claim 1, which is a jig for use in a DC test or an AC test.

7. The jig for use in a semiconductor test according to claim 1, wherein only part of a surface of said insulating material facing said test object comes into contact with said test object.

8. The jig for use in a semiconductor test according to claim 1, wherein a surface of said insulating material facing said test object is coated with Teflon (registered trademark).

9. The jig for use in a semiconductor test according to claim 1, wherein said test object is a wide-gap semiconductor.

* * * * *